United States Patent [19]

Broyles et al.

[11] 4,400,772

[45] Aug. 23, 1983

[54] METHOD AND APPARATUS FOR DIRECT MEMORY ACCESS IN A DATA PROCESSING SYSTEM

[75] Inventors: Douglas W. Broyles, San Jose; Ronald S. Palmer, Sunnyvale, both of Calif.

[73] Assignee: International Memories, Inc., Cupertino, Calif.

[21] Appl. No.: 221,467

[22] Filed: Dec. 30, 1980

[51] Int. Cl.³ .............................................. G06F 13/00
[52] U.S. Cl. .................................................. 364/200
[58] Field of Search ... 364/200 MS File, 900 MS File

[56] References Cited

U.S. PATENT DOCUMENTS

| 4,122,520 | 10/1978 | Adamchick et al. | 364/200 |
| 4,181,934 | 1/1980 | Marenw | 364/200 |
| 4,245,305 | 1/1981 | Geghele et al. | 364/200 |

Primary Examiner—Thomas M. Heckler

[57] ABSTRACT

The method and apparatus in a microprocessor-based data processing system which allows direct access to main memory associated with a central processing unit from peripheral intelligent devices such as mass storage and special processors. Main memory space is allocated in contiguous zones of actual memory and "phantom" memory. An address decoder in connection with a bus buffer separates the peripheral from the CPU or the CPU from the peripheral whenever particular instructions are generated or address space is selected. During direct memory access, the CPU is placed in an idle state without disturbing CPU registers so that secondary functions of the CPU can be continued. The method and apparatus eliminates need for a conventional direct memory access device with its undesirably high overhead and support requirements.

10 Claims, 4 Drawing Figures

4,400,772

METHOD AND APPARATUS FOR DIRECT MEMORY ACCESS IN A DATA PROCESSING SYSTEM

BACKGROUND OF THE INVENTION

1. Field of Invention

This invention relates to data processing systems and particularly to data transfer techniques between peripheral devices and main memory related to a relatively slow central processing unit (CPU) such as a microprocessor.

A typical microprocessor, such as a Zilog Z-80 or Intel 8080 is frequently incapable of handling high-speed data transfer functions under program control, as between high-speed peripheral devices such as disk drives and main memory, while maintaining other necessary functions. To solve this problem of limitations on high data transfer rates, direct memory access (DMA) circuitry is needed. Typical DMA circuitry, such as a Zilog Z-80-DMA type integrated circuit, places a CPU in a WAIT state and then takes over the CPU address and data lines to directly address, read from or write to main memory. A DMA device is typically a complex circuit requiring address counters, port counters, byte counters, random control logic and several control status registers, much of which is redundant with the address register, bus drivers and control logic associated with or a part of the CPU. Consequently, a standalone DMA device may cost more than a CPU and require appreciable program storage in the main memory in order to support its operation. The DMA device may also interfere with important system operations. In some microprocessor devices such as the Z-80 CPU, certain secondary functions are provided over the data bus between instruction cycles. For example, refresh information may be fed to dynamic random access memory (dynamic RAM) during interim periods. A DMA circuit which takes control of the system input-/output bus typically interrupts the secondary function, thereby creating a potential for memory failure.

Other problems created by DMA circuits include potential for indefinite suspension of processing and data bus access in the event of noncoincidence between the number of bytes in a DMA byte counter and the number of bytes transferred from the peripheral device.

What is therefore needed is a technique and apparatus which allows direct memory access to main memory in a data processing system without disrupting system operation.

SUMMARY OF THE INVENTION

According to the invention, whenever a direct memory access (DMA) interrupt in a data processing system is desired in order to allow a peripheral direct access to main memory, system control is partially retrieved from its central processor which is then placed in an idle mode for a data transfer period up to the size required to fill a phantom memory in the memory space. As used herein, phantom memory refers to memory space addressed by the address register but physically allocated to another portion of the memory space. During the idle mode of operation, the central processing unit (CPU) is permitted to continue its normal secondary functions. Data transfer may be terminated automatically after a preset number of transfers or after a specific address is decoded, and program control is returned to the CPU. An apparatus for operating a data processing system according to this technique comprises an address decoder which detects special addresses in phantom memory space and determines accordingly what type of instruction is to be implemented in response to address space selected by the CPU for direct memory access, an instruction generator, and a bus buffer. The bus buffer is operative to disable data transfer directed to the CPU whenever the phantom memory is addressed by the address decoder. The data processing system includes memory space which is divided into units of actual memory, where DMA data is stored, and phantom memory space, which when addressed allows the decoder to initiate processor-independent operations. In the memory address the address bits signifying the contiguous zones of memory and ORed together in order to double allocate memory regions. In a preferred embodiment the CPU attempts to fetch instructions from the phantom memory zone through the instruction generator, but the instruction generator sends out a stream of no operation (NOP) instructions whenever the decoder detects fetch instructions directed to the phantom memory space. Set-up time for a data transfer in the present technique is much faster than the set-up time for conventional DMA transfer, since control bytes and counters in the system need not be initialized. Moreover, only standard Call Subroutine and Return From Subroutine instructions can be used in connection with the central processor so that information stored in the registers of the central processor is not disturbed.

Data processing systems structured in this manner and operative according to the invention technique can be enhanced by addition of special function devices which communicate with main memory in the same manner as herein described. For example, special functions such as fault isolation and diagnosis may be implemented by testing each bus separately once the I/O portion of the bus is separated from the central processor portion of the bus. Advanced function devices such as Fast Fourier Transform function devices, error correction devices and other arithmetic processor devices can be added to a system according to the invention whereby direct access is had to main memory while the CPU is idling or in special cases operating in a concurrent function mode.

BRIEF DESCRIPTION OF THE DRAWINGS

The invention will be better understood by reference to the following detailed description taken in conjunction with the accompanying drawings in which.

DETAILED DESCRIPTION OF SPECIFIC EMBODIMENTS

Figure 1:
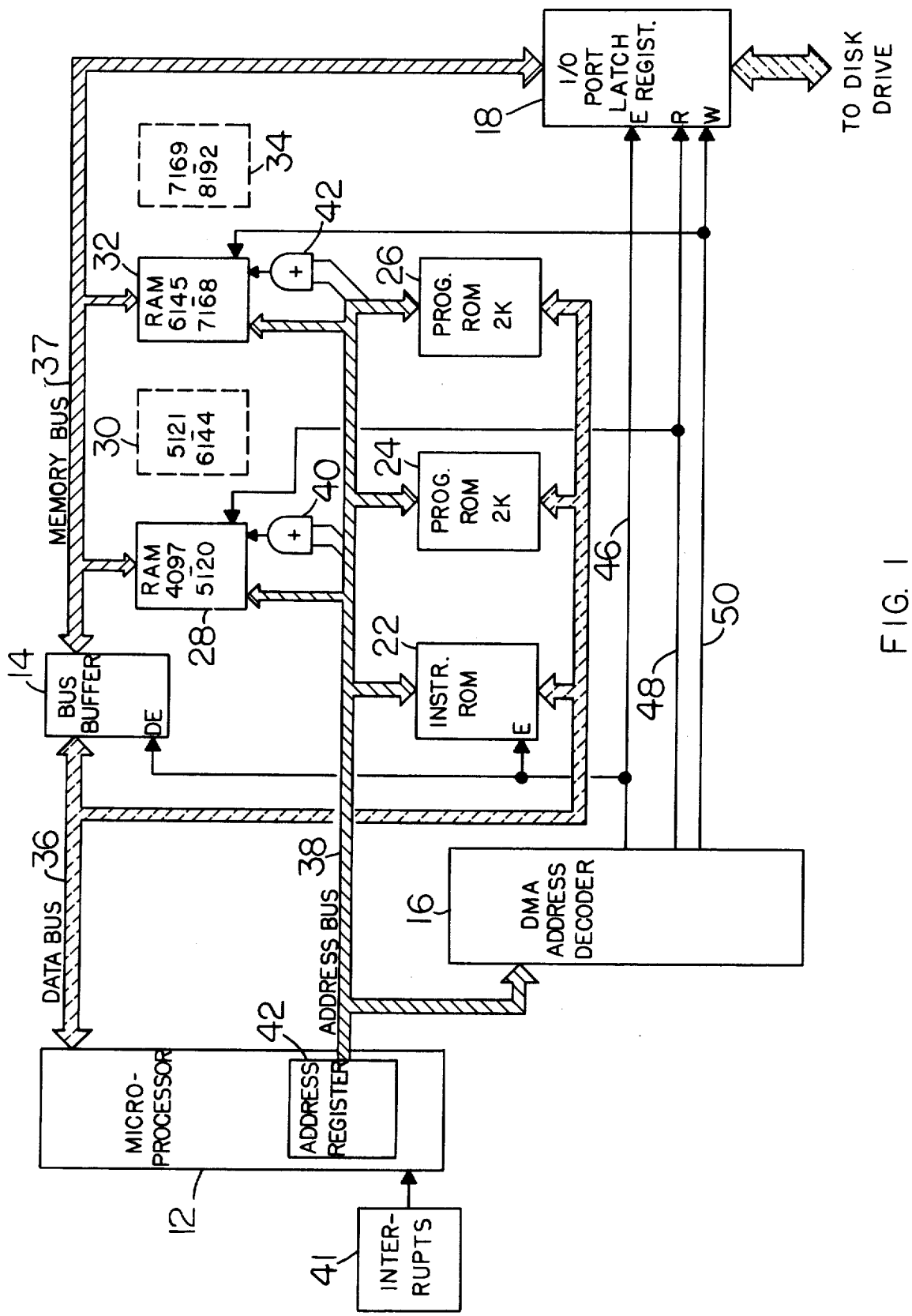
FIG. 1 is a schematic diagram of a system according to the invention.

FIG. 1 shows a data processing system according to the invention wherein a central processing unit, a microprocessor 12, such as an Intel 8080 or Zilog Z-80, is employed in a configuration having a bus buffer 14, a DMA address decoder 16, an I/O port latch register 18, instruction read only memory (ROM) 22, program ROM 24 and 26, and random access memory sockets corresponding to addressable memory space of 8,192 bytes (8K bytes) of memory. Memory space accommodates random access memory units of, for example, 1K byte capacity each. A first random access memory device 28 is emplaced in a first position. A second position 30 of 1K bytes is blank, a third position accommodates a RAM device 32 of 1K bytes, and a fourth position 34 sets aside 1K bytes of blank space.

Figure 2:
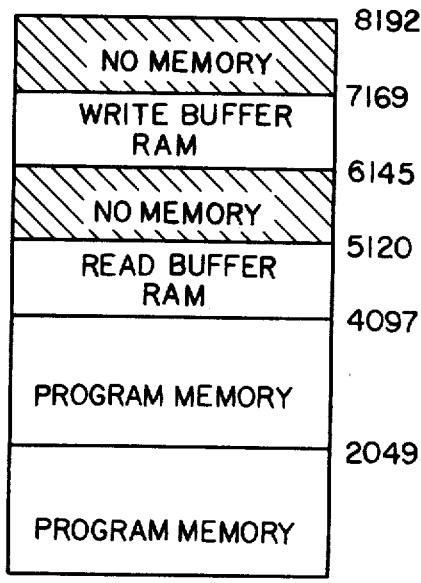
FIG. 2 is a memory map showing actual and phantom memory zones.

FIG. 2 shows the organization or memory map of the DMA system described in connection with FIG. 1. The lower 4K of memory is set aside for program. The memory space between 4K and 5K (address 4097 and 5120) is set aside as a Read buffer. The memory space between 5K and 6K is the phantom memory which is empty so that program control can be captured from the microprocessor for Read operations whenever that memory space is addressed, the program space between 6K and 7K is set aside for a Write buffer, and the memory space between 7K and 8K is empty so that program control for Write operations can be captured from the microprocessor 12 whenever the memory space is addressed.

The microprocessor 12 (FIG. 1) has a variety of input and output terminals, not all of which are shown here. A first set of terminals is a port which accommodates data, designated the microprocessor unit data bus 36. A second set of terminals is a port which accommodates address information designated the system address bus 38. A third terminal accommodates interrupt signals from an external interrupt device 41. Within the microprocessor 12 is an address register 42. The microprocessor data bus 36 is coupled to the instruction ROM 22, program ROMs 24 and 26 and bus buffer 14.

A second port of the bus buffer 14 is coupled to a memory bus 37. The memory bus 37 is coupled to each RAM device 28, 32 and to I/O port latch register 18. The I/O port latch register 18 interfaces respectively with an external peripheral unit such as a disk drive. Coupled across the address bus 38 are OR gates 40 and 42. Each of the OR gates 40, 42 receives as two inputs the most significant bit address of the addressable memory 28, 32 and the most significant bit of the memory locations of the adjacent postions 30 and 34 of the phantom memory. The outputs of the respective OR gates 40 and 42 are each the most significant bit of the respective addressable memories 28 and 32. All of the remaining address bus conductors are coupled to their respective terminals of the address port for the addressable memories 28 and 32.

The DMA address decoder 16 has as its input the address from the address bus 38. A Transfer Enable line 46 from the decoder 16 is coupled to an Enable input of the I/O port latch register 18, an Enable input of instruction ROM 22 and to a disable (DE) input of bus buffer 14. A Read Enable line 48 is coupled to the enable input of the first RAM 28 and to the Read Enable input of the I/O port latch register 18. A Write Enable input 50 is coupled to the Enable input of the second RAM 32 and to Write Enable input of the I/O port 18.

According to the invention, the DMA address decoder 16 decodes the address on the address buffer 38 to control the instruction set response of the microprocessor 12, whenever phantom memory is addressed to disable the bus buffer 14, and to enable the appropriate high-speed data transfer element (in this case the I/O port latch register) and memory locations for direct memory transfer of data through the memory bus 37. The internal address register 42 of the microprocessor 12 is not disturbed during the data transfer process as the microprocessor 12 is executing no operation (NOP) instructions under control of the decoder 16.

In normal operation the microprocessor 12 under program control of program ROMs 24 and 26 brings data from a first peripheral such as a disk drive through I/O port latch register 18, thence through bus buffer 14 into a register (not shown) of the microprocessor 12. The microprocessor 12 then checks the data for errors, formats or unformats the data, and then stores it in memory. On request the microprocessor 12 unloads the data through the I/O port latch register 18 to the peripheral device.

When the transfer rate of the peripheral, generally a disk drive, exceeds the rate at which the microprocessor 12 can respond (which in the state of the art microprocessors such as the Z-80 is about one million bytes per second) the Load/Store commands of the microprocessor cannot be used. A direct memory access (DMA) scheme is therefore required to transfer data directly between the I/O port latch register 18 and random access memory 28 and 32. The practical upper rate limit of data transfer is one byte per machine cycle.

In the structure shown in FIG. 1, bus buffer 14 is enabled only when RAM 28 and RAM 32 are addressed. However, the first RAM 28 is addressed whenever the phantom memory space for RAM 28, that is, the position 30, is addressed, since the gate 40 ORs the appropriate address bits of the address bus 38. Similarly, the second RAM 32 is addressed whenever the phantom memory space for RAM 32, namely, the position 34, is addressed.

In the DMA process according to the invention, an interrupt 41 is generated and applied to the microprocessor 12, signifying that the peripheral connected to the I/O port latch register 18 is ready to input its data. In the Z-80-type microprocessor, this interrupt causes a Jump Subroutine instruction to be generated so that the microprocessor 12 is stimulated to read a subroutine through a Subroutine Call instruction. However, the address decoder 16 decodes the Jump Subroutine address as a transfer operation, stimulating the transfer enable line 46 to enable the I/O port latch register 18 and the instruction ROM 22. This causes the instruction ROM 22 to place a "No Operation" (NOP) instruction on the microprocessor data bus 36. The decoder 16 also disables the bus buffer 14 whenever a memory location on the address bus 38 specifies an address in the memory space for which there is no random access memory, e.g., position 30 and 34. In this manner, the microprocessor data bus 36 is separated from the memory bus 37.

Simultaneously with the disablement of the bus buffer 14, the I/O port latch register 18 conveys one byte of data from its peripheral to the memory bus 37 to the addressed memory location, for example, in RAM 28. The microprocessor 12 then increments the address register 42 and the instruction ROM continues to issue NOP instructions so that the microprocessor 12 remains in idle mode. The process repeats itself with data continuously filling the RAM 28 until the largest or highest address location is filled. Upon completion of the data transfer, usually at the occurrence of a preselected address of an increment counter in the microprocessor 12, instruction ROM 22 issues its last instruction, namely, that of "Return From Subroutine," so that the microprocessor address register 42 is reloaded with the instruction location of the program running before the direct memory access call was initiated. The microprocessor 12 then continues processing instructions in the normal manner.

A Write to Disk operation is performed in much the same manner. However, in this operation, the microprocessor 12 is set up for a Write operation by addressing the phantom memory space at position 34. In particular, the Call Subroutine instruction of the microprocessor 12 addresses the memory location in position 34. The address is decoded by the decoder 16 as a Write transfer, which enables the random access memory 32 and the output functions of the I/O port latch register 18 via Write Buffer Enable line 50. The microprocessor 12 selects the number of bytes to be transferred by choosing the initial call address to be the desired number of bytes from the end of the phantom memory space. When the phantom memory space has been exhausted by the increment counter, the decoder 16 responds to the address to cause the instruction ROM 22 to initiate the Return From Subroutine instruction and to allow data to be exchanged through the bus buffer 14.

Figure 3:
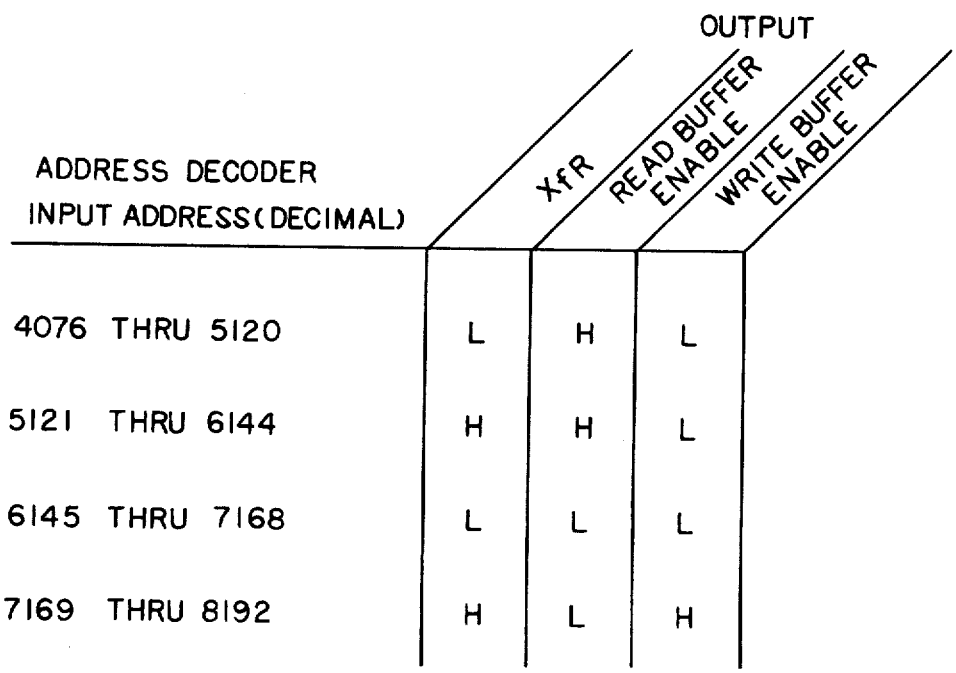
FIG. 3 is a truth table for a DMA address decoder according to the invention.

FIG. 3 is an example of a truth table which describes the function of the address decoder 16. The input to the address decoder 16 is the address bus 38 of the system. The outputs are special function lines, such as Transfer Enable 46, Read Buffer Enable 48 and Write Buffer Enable 50. FIG. 3 describes all that is necessary for one of ordinary skill in the art to reconstruct an address decoder 16. The address decoder 16 herein shown is designed for buffers of standard 1K byte allocation for reading and writing. Leading bits can be added to change the base address for operation of the decoder. An L indicates low and an H indicates high. The bus buffer 14 is disabled by an H signal at its DE input. All other inputs are enabled by an H signal.

When an address is decoded to be between 4K and 5K the line 48 is set high. When an address coded to be between 5K and 6K, line 48 and line 46 are set high. When an address is decoded to be between 6K and 7K, no line is set high. When the address is decoded to be between 7K and 8K line 46 and line 50 are set high. While the truth table of decoder 16 suggests particular functions, such as Read Enable and Write Enable, these lines can also be used for initiating special functions, such as Error Correction and high-speed arithmetic processing function, as hereinafter explained.

This embodiment has shown the example of only two RAMs 28 and 32 with adjacent phantom memory spaces at positions 30 and 34. The number of channels of direct memory access is limited only by the number of random access memory segments which have designated memory spaces and by the configuration of the DMA address decoder 16. For example, the DMA address decoder 16 may be a single-channel device which is suitable for use in sets corresponding to the number of I/O ports or data transfer elements.

One of the features of the invention as implemented is that the microprocessor 12 is never placed in a WAIT state during data transfer, thus making it impossible for a peripheral to seize the data bus and thereby lock up the system. The microprocessor 12 can continue to operate to refresh any dynamic memory used in the system. Still further, the time required to enter the DMA mode is substantially reduced since the system uses a decoder 16 which responds directly to an address rather than a separate DMA device which must be programmed with up to six command bytes before a call of the DMA function can be issued.

Figure 4:
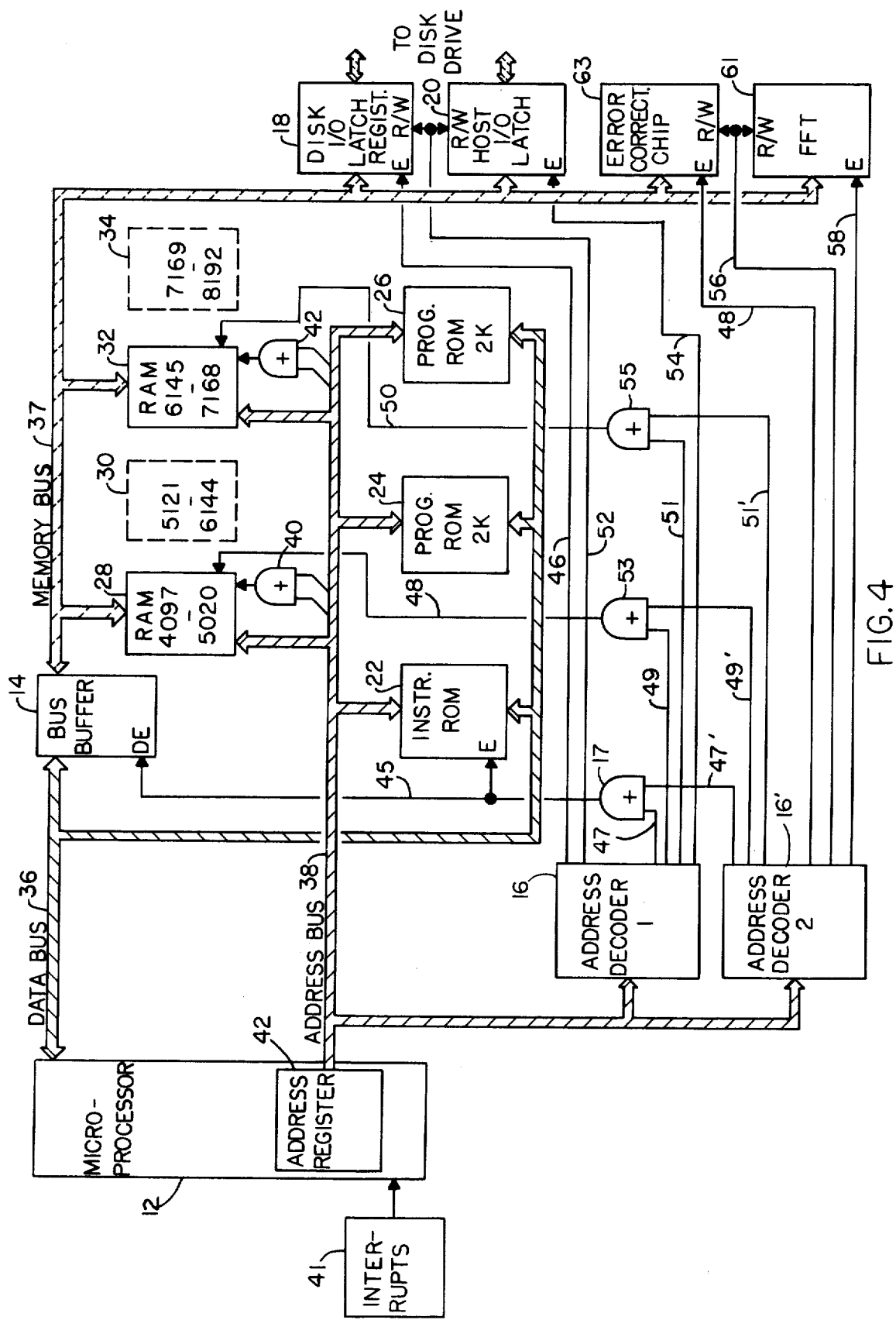
FIG. 4 is a schematic diagram of a second embodiment of the invention.

Turning to FIG. 4, a microprocessor system is shown in which two special functions and two I/O ports are used. The microprocessor 12 has a microprocessor data bus 36 and an address bus 38 to which is connected an instruction ROM 22. A first address decoder 16 and a second address decoder 16' are connected to receive addresses from the address bus 38. A ROM Enable/Bus Disable line 45 from the address decoders 16 and 16' is coupled through lines 47 and 47' through OR gate 17 to the instruction ROM 22 and the bus buffer 14. A memory data bus 37 is coupled to all random access memory chips 28 and 30, and all special function devices, which in this case include a Disk I/O chip 18, a host I/O chip 20, a Fast Fourier Transform function chip 61 and Error Correction function chip 63. The address bus 38 is also coupled to the address ports of the RAM chips 28 and 32. The appropriate address bits of phantom memory in positions adjacent the memory space occupied by RAM 28 and 30 are ORed together in OR gates 40 and 42 such that actual memory space is accessed when phantom memory space is addressed.

In addition, first and second address decoders 16 and 16' provide Enable inputs through lines 49 and 49' to an OR gate 53 which is coupled through line 48 to the Chip Enable input of the first RAM 28. Also, first and second address decoders 16 and 16' provide Enable inputs through lines 51 and 51' to an OR gate 55 which is coupled through line 50 to the Chip Enable input of RAM 32.

Special function lines 46, 52, 54, 56 and 58 couple the address decoders 16 and 16' to the special function chips 18, 20, 61 and 63 as follows: Line 46 is an I/O Enable line coupling the first address decoder 16 with the disk I/O latch register 18. Line 54 is an I/O Enable line coupling the first address decoder 16 with the host I/O latch register 20. Line 52 is a Read/Write line coupling the first address decoder 16 with the R/W input of both latch registers 18 and 20. Line 48 is a special function enable line coupling the second address decoder 16' to the Enable input of the Error Correction chip 63. Line 58 is a special function Enable line coupling the second address decoder 16' to the Enable input of the Fast Fourier Transform chip 61. Finally, line 56 is a Read/Write line coupling the second address decoder 16' with the R/W input of both special function chips 61 and 63.

The Error Correction function of Error Correction chip 63 is explained to illustrate the invention. This function is used normally to correct data in RAM chip 28. The Error Correction chip 63 is a standard chip, such as a AMZ8065 chip manufactured by American Micro Devices, which responds to a FIRE code and which requires that data be shifted rapidly through its internal generator/decoder. When the Error Correction function is called, the microprocessor 12 responds with a JUMP instruction which is an address space in phantom memory, for example, in address space between 3K and 4K, assuming no program ROM is located in these address spaces. The decoder 16' enables the instruction ROM 22, the RAM 28 and Error Correction function 63. The Error Correction function 63 is data block-oriented performing instructions at one byte per memory cycle. Once the correction process is complete, i.e., when the address decoder 16' detects that the incrementing clock of the microprocessor has exhausted the allocated phantom memory space, the instruction ROM 22 loads the microprocessor 12 with a JUMP RETURN instruction, the system is fully restored and the microprocessor program is resumed.

Various other special purpose functions can be accomplished using the same data stored in RAM chip 28 at its memory location. The address decoder need only decode an address which is designated for other phantom memory locations so that the instruction ROM 22 can obtain program control. The Enable line 48 allows other functions to be enabled with access to the data in RAM chip 28. For example, a Fast Fourier Transform function can be executed on the data in RAM chip 28 whenever lines 56 and 58 are activated.

All the addressing, control, and interrupt capability of the microprocessor-based system continues to reside in the microprocessor 12. Thus, the microprocessor 12 can suspend operation, service an interrupt, and return to a special function operation without any additional hardware or programming complexity.

The invention has now been explained with reference to specific embodiments. Other embodiments will be apparent to those of ordinary skill in the art. It is therefore not intended that this invention be limited except as indicated by the appended claims.

What is claimed is:

1. In a data processing system comprising a data transfer means which is capable of direct memory access to data associated with a central processing unit, said data transfer means having data ports capable of data transfer, independent of said cantral processing unit, a central processing unit with a data port, an address port and an interrupt port, said central processing unit being responsive to specific external digital signals, such as interrupt signals and instruction signals, for issuing digital address signals to an addressable memory space, memory means for storing data associated with said central processing unit and arranged in memory units, each said memory unit having memory locations with addresses within said memory space, an address port and a data input/output port, the improvement comprising:
    an address decoder having an address input port and a control output port, said decoder being coupled to a third bus means and operative to generate specific digital control signals in response to address information directed by said central processing unit to addresses, designated herein vacant addresses, in said memory space which are addresses other than of said memory locations of said memory means, said address information being operative to permit transfer of instruction control from said central processing unit;
    means having an address input port and a data output port for generating digital data representative of instructions for said central processing unit;
    first bus means coupling together said data port of said instructions generating means and said data port of said central processing unit;
    second bus means coupling together each said data port of said memory means and said data port of said data transfer means;
    third bus means coupling together said address port of said instructions generating means, with each said address port of said memory means and said central processing unit; and
    gate means coupled to said third bus means and to specific portions of said memory means for allocating address information directed at selected portions of said memory space to other portions of said memory space within said memory means, said address decoder further being coupled through control output ports to said data transfer means and operative through said control output ports to enable data transfer between said memory means via said second bus means through said data port of said data transfer means in response to receipt of special addresses from said central processing unit designated for use with instructions external of said central processing unit.

2. The data processing system according to claim 1 further including a buffer having a first data port coupled to said first bus means and a second data port coupled to said second bus means for conveying digital data between said central processing unit and said memory means, said buffer having an enable input coupled to a selected decoder control output means wherein said address decoder includes a selected control output means operative to disable said buffer whenever said special addresses are applied to said bus.

3. The data processing system according to claim 1 wherein said instructions generating means is operative to apply a no operation instruction to said first bus means and thence to the data port of said central processing unit in order to place said central processing unit in an idling mode, said central processing unit being able to continue incrementing a system address register.

4. The data processing system according to claim 3 wherein said address decoder includes means operative in response to a decoded address applied by said central processing unit to said third bus means during a no operation instruction to cause said instructions generating means to return instruction control to said central processing unit.

5. The data processing system according to claim 2 wherein said data transfer means comprises a plurality of input/output latch registers, each being assigned to a specific data transfer device, and wherein memory space is allocated for each data transfer device in units of size corresponding to the size of said memory means to which said data transfer device is allocated by said gate means.

6. The data processing system according to claim 2 wherein said gate means comprises an OR gate whose input terminals are coupled to selected most significant address bits of a memory space of a plurality of locations so that a plurality of data transfer means can have access to data in a common memory space.

7. The data processing system according to claim 2 wherein said gate means comprises a plurality of OR gates, each of which has an input terminal coupled to a selected most significant address bit of said vacant memory space.

8. A method for providing direct memory access between a memory means in an addressable memory space of a data processing system and a data transfer means comprising:
    decoding an initiating address issued by a central processing unit directed to a special location of a portion of said memory space not corresponding to addresses of locations in said memory means, designated herein vacant memory space, as a no operation instruction for relieving said central processing unit of instruction control without surrendering address incrementing control;
    allocating at least one address of said vacant memory space to said memory means whenever said initiating address is decoded to permit alternative access to locations in said memory means through addresses in said vacant memory space;

initiating data transfer between said data transfer means and said memory means at a rate of no more than one transfer per cycle of operation of said central processing unit in order to permit clock means of said central processing unit to increment address values; and decoding a terminating address issued by said cental processing unit at a specified location in said memory space in order to return instruction control to said central processing unit.

9. The method according to claim 8 and wherein said central processing unit has a data bus, further including the step of decoupling said data bus of said central processing unit from said memory means in response to decoding of said initiating address.

10. The method according to claim 9 further including the step of allocating a plurality of address blocks in said memory space to selected blocks of addresses in said memory means so that a plurality of data transfer means can have access to data in a common location of said memory space.

* * * * *